(12) United States Patent
Yu et al.

(10) Patent No.: US 12,317,761 B2
(45) Date of Patent: May 27, 2025

(54) PHASE-CHANGE MEMORY DEVICE AND METHOD FOR FABRICATING THE SAME

(71) Applicant: Taiwan Semiconductor Manufacturing Company, Ltd., Hsinchu (TW)

(72) Inventors: Shao-Ming Yu, Hsinchu County (TW); Yu-Chao Lin, Hsinchu (TW); Tung-Ying Lee, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 268 days.

(21) Appl. No.: 17/896,060

(22) Filed: Aug. 25, 2022

(65) Prior Publication Data

US 2024/0074334 A1 Feb. 29, 2024

(51) Int. Cl.
*H10N 70/20* (2023.01)
*H10B 63/00* (2023.01)
*H10N 70/00* (2023.01)

(52) U.S. Cl.
CPC .......... *H10N 70/231* (2023.02); *H10B 63/30* (2023.02); *H10N 70/023* (2023.02); *H10N 70/063* (2023.02); *H10N 70/066* (2023.02); *H10N 70/068* (2023.02); *H10N 70/841* (2023.02); *H10N 70/883* (2023.02)

(58) Field of Classification Search
CPC .. H10N 70/231; H10N 70/023; H10N 70/063; H10N 70/066; H10N 70/068; H10N 70/841; H10N 70/883; H10N 70/801; H10N 70/826; H10B 63/30; H10B 63/10; H10B 63/80
USPC .......................................................... 365/163
See application file for complete search history.

(56) References Cited

U.S. PATENT DOCUMENTS

2011/0155993 A1\* 6/2011 Chen .................. H10N 70/8828
438/102

FOREIGN PATENT DOCUMENTS

EP 1848048 A2 \* 10/2007 ............. H01L 45/06

\* cited by examiner

*Primary Examiner* — Huan Hoang
(74) *Attorney, Agent, or Firm* — JCIPRNET

(57) ABSTRACT

A phase-change memory device and a method for fabricating the same are provided. The phase-change memory device comprises a first electrode, a stack and a multi-layered spacer. The first electrode is disposed on and electrically connected to an interconnect wiring of the interconnect structure. The stack is disposed on the first electrode and comprises a phase-change layer disposed on the first electrode and a second electrode disposed on the phase-change layer. The multi-layered spacer covers the stack. A first portion of the multi-layered spacer covers a top surface of the stack, and a second portion of the multi-layered spacer covers a sidewall of the stack.

20 Claims, 15 Drawing Sheets

PHASE-CHANGE MEMORY DEVICE AND METHOD FOR FABRICATING THE SAME

BACKGROUND

Phase change random access memory (PCRAM) is a non-volatile memory device making use of different resistive phases and heat induced phase transition between the phases of phase change materials including chalcogenide and resistive materials. A PCRAM is composed of many cells each of which functions independently. A PCRAM cell mainly includes a heater and a resistor which is a data storage element made mainly of a reversible phase change material to provide at least two dramatically different resistivities for logical "0" state and "1" state.

To read a state (data) from the PCRAM cell, a sufficiently small current is applied to the phase change material without triggering the heater to generate heat. In this way, the resistivity of the phase change material can be measured and the states representing the resistivities, i.e. a "0" state for high resistivity or a "1" state for low resistivity can be read.

To write a state (data) in the PCRAM cell, for example, to write a "1" state representing a low resistivity phase of the phase change material, a medium electric current is applied to the heater which generates heat for annealing the phase change material at a temperature above the crystallization temperature but below the melting temperature of the phase change material for a time period to achieve a crystalline phase. To write a "0" state representing a high resistivity phase of the phase change material, a very large electric current is applied to the heater to generate heat to melt the phase change material at a temperature higher than the melting temperature of the phase change material; and the electric current is abruptly cut off to lower the temperature to below the crystallization temperature of the phase change material to quench and stabilize the amorphous structure of phase change material so as to achieve the high-resistance logical "0" state. The very large electric current can thus be in a pulse form.

Materials of PCRAM are easily suffered damages due to a moisture, a BEOL thermal or a chemical gas etch process. Healthy PCRAM having good performance is desirable.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
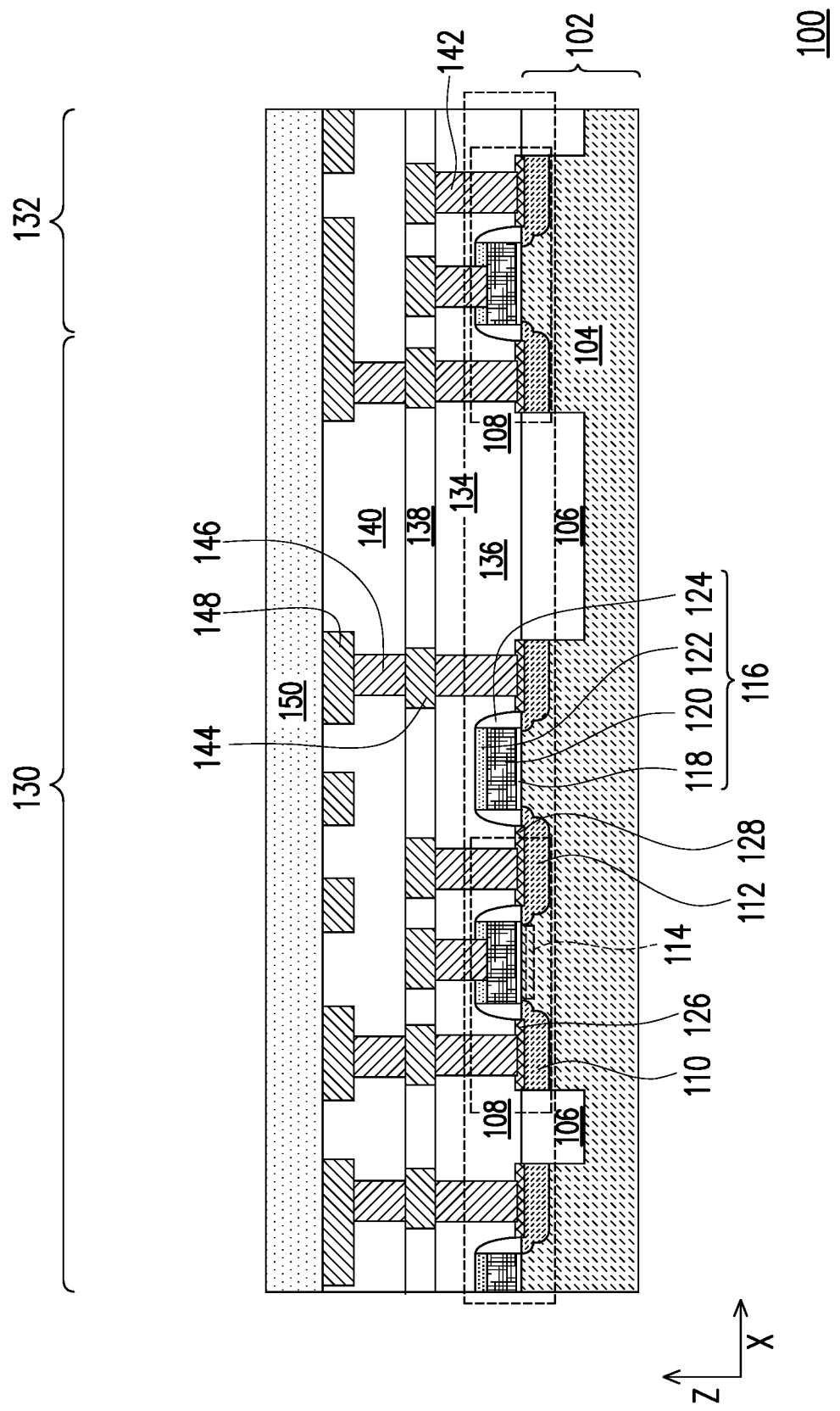
FIG. 1 is a vertical cross-sectional view of a first exemplary structure after formation of complementary metal-oxide-semiconductor (CMOS) transistors, first metal interconnect structures formed in lower-level dielectric material layers, and an isolation dielectric layer in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A phase-change memory device and a method for fabricating the same are provided. In accordance with some embodiments of the present disclosure, a multi-layered spacer covers a stack of a phase-change layer, an electrode and a hard mask. A first portion of the multi-layered spacer covers a top surface of the stack, and a second portion of the multi-layered spacer covers a sidewall of the stack. The multi-layered spacer at least comprises at least one nitride layer and at least one oxide layer. A health phase-change memory device can be obtained by increasing a ratio of the second portion of the multi-layered spacer to the first portion of the multi-layered spacer to prevent the phase-change layer damage, and preventing a moisture from the phase-change memory device and improving the nitride layer adhesion by the oxide layer. Therefore, a performance of the phase-change memory device is improved. In accordance with some embodiments of the present disclosure, Embodiments discussed herein are to provide examples to enable making or using the subject matter of this disclosure, and a person having ordinary skill in the art will readily understand modifications that can be made while remaining within contemplated scopes of different embodiments.

Referring to FIG. 1, FIG. 1 illustrates a semiconductor structure 100, according to various embodiments. The semiconductor structure 100 includes a substrate 102, which may be a semiconductor substrate such as a commercially available silicon substrate. The substrate 102 may include a semiconductor material layer 104 or at least at an upper portion thereof. The semiconductor material layer 104 may be a surface portion of a bulk semiconductor substrate, or may be a top semiconductor layer of a semiconductor-on-insulator (SOI) substrate. In one embodiment, the semiconductor material layer 104 includes a single crystalline semiconductor material such as single crystalline silicon. In one embodiment, the substrate 102 may include a single crystalline silicon substrate including a single crystalline silicon material.

Shallow trench isolation structures 106 including a dielectric material such as silicon oxide may be formed in an upper portion of the semiconductor material layer 104. Suitably doped semiconductor wells, such as p-type wells and n-type wells, may be formed within each area that is laterally enclosed by a portion of the shallow trench isolation structures 106. Field effect transistors 108 may be formed over a top surface of the semiconductor material layer 104. For example, each of the field effect transistors 108 may include a source electrode 110, a drain electrode 112, a semiconductor channel 114 that includes a surface portion of the substrate 102 extending between the source electrode 110 and the drain electrode 112, and a gate structure 116. The semiconductor channel 114 may include a single crystalline semiconductor material.

Each gate structure 116 may include a gate dielectric layer 118, a gate electrode 120, a gate cap dielectric 122, and a dielectric gate spacer 124. A source-side metal-semiconductor alloy region 126 may be formed on each source electrode 110, and a drain-side metal-semiconductor alloy region 128 may be formed on each drain electrode 112. The devices formed on the top surface of the semiconductor material layer 104 may include complementary metal-oxide-semiconductor (CMOS) transistors and optionally additional semiconductor devices (such as resistors, diodes, capacitors, etc.), and are collectively referred to as CMOS circuitry 134.

The semiconductor structure 100 of FIG. 1 may include a memory array region 130 in which an array of memory cells may be subsequently formed. The first exemplary structure may further include a peripheral region 132 in which metal wiring for the array of memory devices is provided. Generally, the field effect transistors 108 in the CMOS circuitry 134 may be electrically connected to an electrode of a respective memory cell by a respective set of metal interconnect structures.

Devices (such as field effect transistors 108) in the peripheral region 132 may provide functions that operate the array of memory cells to be subsequently formed. Specifically, devices in the peripheral region may be configured to control the programming operation, the erase operation, and the sensing (read) operation of the array of memory cells. For example, the devices in the peripheral region may include a sensing circuitry and/or a programming circuitry.

One or more of the field effect transistors 108 in the CMOS circuitry 134 may include a semiconductor channel 114 that contains a portion of the semiconductor material layer 104 in the substrate 102. If the semiconductor material layer 104 includes a single crystalline semiconductor material such as single crystalline silicon, the semiconductor channel 114 of each of the field effect transistors 108 in the CMOS circuitry 134 may include a single crystalline semiconductor channel such as a single crystalline silicon channel. In one embodiment, a plurality of field effect transistors 108 in the CMOS circuitry 134 may include a respective node that is subsequently electrically connected to a node of a respective memory cell to be subsequently formed. For example, a plurality of field effect transistors 108 in the CMOS circuitry 134 may include a respective source electrode 110 or a respective drain electrode 112 that is subsequently electrically connected to a node of a respective memory cell to be subsequently formed.

In one embodiment, the CMOS circuitry 134 may include a programming control circuit configured to control gate voltages of a set of field effect transistors 108 that may be used for programming a respective memory cell (e.g., a ferroelectric memory cell) and to control gate voltages of transistors (e.g., thin-film transistors) to be subsequently formed. In this embodiment, the programming control circuit may be configured to provide a first programming pulse that programs a respective ferroelectric dielectric material layer in a selected ferroelectric memory cell into a first polarization state in which electrical polarization in the ferroelectric dielectric material layer points toward a first electrode of the selected ferroelectric memory cell, and to provide a second programming pulse that programs the ferroelectric dielectric material layer in the selected ferroelectric memory cell into a second polarization state in which the electrical polarization in the ferroelectric dielectric material layer points toward a second electrode of the selected ferroelectric memory cell.

In one embodiment, the substrate 102 may include a single crystalline silicon substrate, and the field effect transistors 108 may include a respective portion of the single crystalline silicon substrate as a semiconducting channel. As used herein, a "semiconducting" element refers to an element having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant.

According to an embodiment, the field effect transistors 108 may be subsequently electrically connected to drain electrodes and gate electrodes of access transistors including semiconducting metal oxide plates to be formed above the field effect transistors 108. In one embodiment, a subset of the field effect transistors 108 may be subsequently electrically connected to at least one of the drain electrodes and the gate electrodes. For example, the field effect transistors 108 may include first word line drivers configured to apply a first gate voltage to first word lines through a first subset of lower-level metal interconnect structures to be subsequently formed, and second word line drivers configured to apply a second gate voltage to second word lines through a second subset of the lower-level metal interconnect structures. Further, the field effect transistors 108 may include bit line drivers configured to apply a bit line bias voltage to bit lines to be subsequently formed, and sense amplifiers configured to detect electrical current that flows through the bit lines during a read operation.

Various metal interconnect structures formed within dielectric material layers may be subsequently formed over the substrate 102 and the semiconductor devices thereupon (such as field effect transistors 108). In an illustrative example, the dielectric material layers may include, for example, a first dielectric material layer 136 that may be a layer that surrounds the contact structure connected to the source and drains (sometimes referred to as a contact-level dielectric material layer), a first interconnect-level dielectric material layer 138, and a second interconnect-level dielectric material layer 140. The metal interconnect structures may include device contact via structures 142 formed in the first dielectric material layer 136 and contact a respective component of the CMOS circuitry 134, first metal line structures 144 formed in the first interconnect-level dielectric material layer 138, first metal via structures 146 formed in a lower portion of the second interconnect-level dielectric material layer 140, and second metal line structures 148 formed in an upper portion of the second interconnect-level dielectric material layer 140.

Each of the dielectric material layers 136, 138, 140 may include a dielectric material such as undoped silicate glass, a doped silicate glass, organosilicate glass, amorphous fluorinated carbon, porous variants thereof, or combinations thereof. Each of the metal interconnect structures 142, 144, 146, 148 may include at least one conductive material, which may be a combination of a metallic liner (such as a metallic nitride or a metallic carbide) and a metallic fill material. Each metallic liner may include TiN, TaN, WN, TiC, TaC, and WC, and each metallic fill material portion may include W, Cu, Al, Co, Ru, Mo, Ta, Ti, TiN, alloys thereof, and/or combinations thereof.

Other suitable metallic liner and metallic fill materials within the contemplated scope of disclosure may also be used. In one embodiment, the first metal via structures 146 and the second metal line structures 148 may be formed as integrated line and via structures by a dual damascene process. The dielectric material layers 136, 138, 140 are herein referred to as lower-lower-level dielectric material layers. The metal interconnect structures 142, 144, 146, 148 formed within in the lower-level dielectric material layers are herein referred to as lower-level metal interconnect structures.

While the disclosure is described using an embodiment in which an array of memory cells may be formed over the second line-and-via-level dielectric material layer 140, embodiments are expressly contemplated herein in which the array of memory cells may be formed at a different metal interconnect level.

An array of thin-film transistors and an array of ferroelectric memory cells (or other types of memory cells) may be subsequently deposited over the dielectric material layers 136, 138, 140 that have formed therein the metal interconnect structures 142, 144, 146, 148) The set of all dielectric material layer that are formed prior to formation of an array of thin-film transistors or an array of ferroelectric memory cells is collectively referred to as lower-level dielectric material layers 136, 138, 140. The set of all metal interconnect structures that is formed within the lower-level dielectric material layers 136, 138, 140 is herein referred to as first metal interconnect structures 142, 144, 146, 148. Generally, first metal interconnect structures 142, 144, 146, 148 formed within at least one lower-level dielectric material layer 136, 138, 140 may be formed over the semiconductor material layer 104 that is located in the substrate 102.

According to an embodiment, thin-film transistors may be subsequently formed in a metal interconnect level that overlies that metal interconnect levels that contain the lower-level dielectric material layers 136, 138, 140 and the first metal interconnect structures 142, 144, 146, 148. In one embodiment, a planar dielectric material layer having a uniform thickness may be formed over the lower-level dielectric material layers 136, 138, 140. The planar dielectric material layer is herein referred to as an insulating matrix layer 150. The insulating matrix layer 150 may include a dielectric material such as undoped silicate glass, a doped silicate glass, organosilicate glass, or a porous dielectric material, and may be deposited by chemical vapor deposition. The thickness of the insulating matrix layer 150 may be in a range from 20 nm (i.e., 200 angstrom) to 300 nm (i.e., 3000 angstrom), although lesser and greater thicknesses may also be used.

Generally, interconnect-level dielectric layers (such as the lower-level dielectric material layer 136, 138, 140) containing therein the metal interconnect structures (such as the first metal interconnect structures 142, 144, 146, 148) may be formed over semiconductor devices. The insulating matrix layer 150 may be formed over the interconnect-level dielectric layers. Other passive devices may be formed in BEOL processes. For example, various capacitors, inductors, resistors, and integrated passive devices may be utilized with other BEOL devices.

FIG. 2A to FIG. 2G illustrate the cross-sectional views of intermediate stages in the formation of a phase-change memory device in accordance with some embodiments.

Figure 2A:
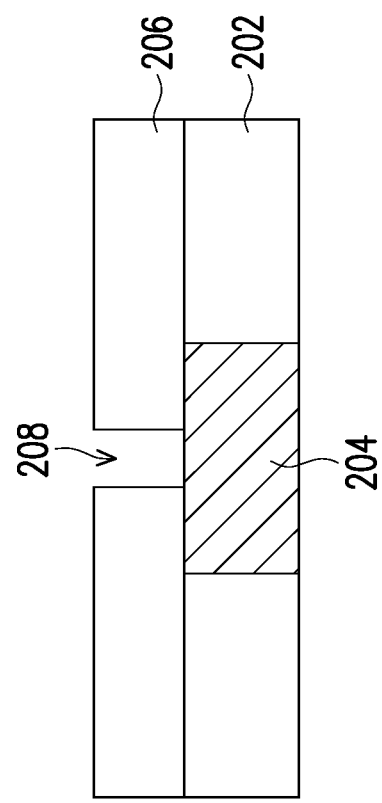
FIG. 2A to FIG. 2G illustrate the cross-sectional views of intermediate stages in the formation of a phase-change memory device in accordance with some embodiments.

Referring to FIG. 2A, an interconnect wiring 204 (i.e., a metal interconnect structure of an interconnect structure) is formed within a first dielectric layer 202 (i.e., an inter-layer dielectric layer of the interconnect structure). A removal process or a patterning process (e.g., an anisotropic etch process) is performed on a second dielectric layer (i.e., an inter-layer dielectric layer of an interconnect structure) 206 on the interconnect wiring 204 and the first dielectric layer 202 to remove a portion of the second dielectric layer 206 thereby an opening 208 (e.g., a cavity) is formed in the second dielectric layer 206. In some embodiments, a photoresist (not shown) is formed over the second dielectric layer 206. The photoresist may then be patterned using photolithography techniques to generate an opening in the photoresist. The patterned photoresist may then be used as a mask for patterning the second dielectric layer 206. In this regard, an anisotropic etch process may be performed to remove a region of the second dielectric layer 206 to form the opening 208 in the region of the second dielectric layer 206. After performing the removal process (e.g., an anisotropic etch process), any residual photoresist is removed by an ash process or by dissolution with a solvent.

Figure 2B:
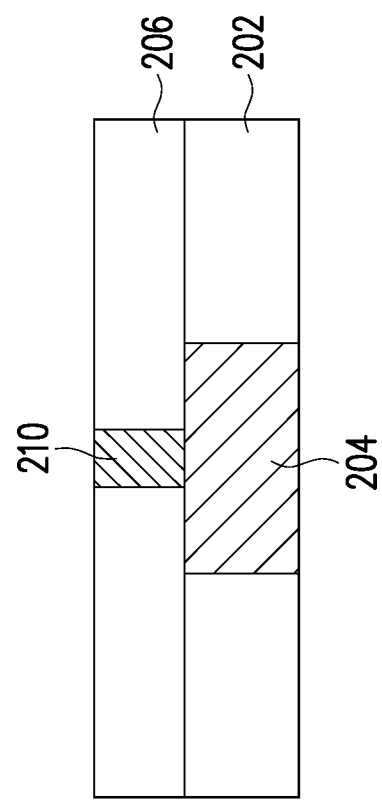

Referring to FIG. 2B, a first electrode layer (not shown) is deposited on the second dielectric layer 206 such that the opening 208 defined in the second dielectric layer 206 is filled with the first electrode layer. The first electrode layer not only fills the opening 208 defined in the second dielectric layer 206, but also covers the top surface of the second dielectric layer 206. The first electrode layer 206 may include a metallic liner material and/or a metallic fill material. The metallic liner material may include a conductive metallic nitride or a conductive metallic carbide such as TiN, TiN/W, Ti/Al/Ti, TaN, WN, TiC, TaC, and/or WC. The metallic fill material may include polysilicon, Al, Cu, Ti, Ta, W, Co, Mo, C, TiN, TaN, TiAl, TiAlN, WN, TaCN, TaC, TaSiN, AlCu, nickel silicide, cobalt silicide, alloys thereof, and/or combinations thereof. Other suitable metallic liner and metallic fill materials within the contemplated scope of this disclosure may also be used. The metallic liner material and metallic fill materials may be formed by suitable deposition process, which may include one or more of a CVD process, a PVD process, an ALD process, an electroplating process, etc. Other suitable deposition processes are within the contemplated scope of disclosure.

Next, a removal process (e.g., a planarization process) is performed to remove excess portions of the first electrode layer until the top surface of the patterned second dielectric layer 206 is revealed such that a first electrode (i.e., a bottom electrode) 210 is formed in the opening 208. The first electrode 210 is embedded in the defined in the second dielectric layer 206, and the top surface of the first electrode 210 substantially levels with the top surface of the patterned first dielectric layer 206. The above-mentioned removal process may include a CMP process although other suitable removal processes may be used. A thickness of the first electrode 210 may be in a range from approximately 5 nm to approximately 100 nm, such as from approximately 10 nm to approximately 50 nm, although other embodiments may include smaller and larger thicknesses.

Figure 2C:
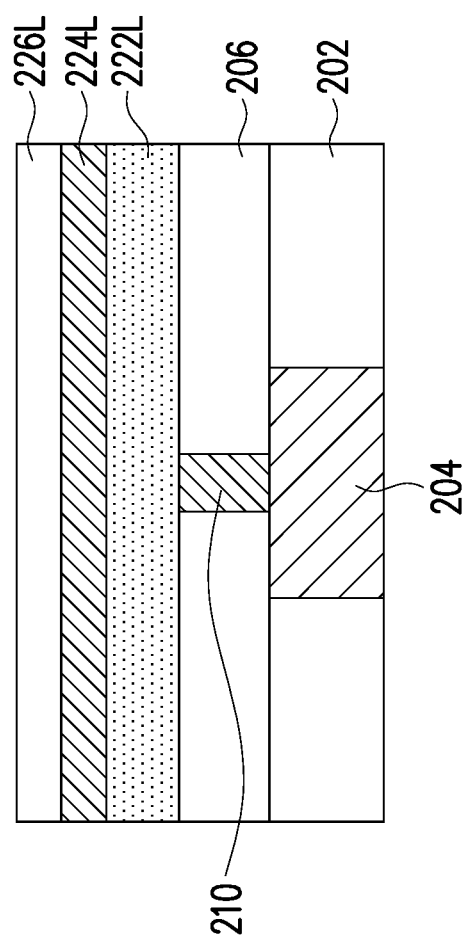

Referring to FIG. 2C, a phase-change material layer 222L is formed on the first electrode 210 and the patterned second dielectric layer 206. Then, a second electrode layer 224L is formed on the phase-change material layer 222L, and a hard mask layer 226L is formed on the second electrode layer 224L in an order.

The phase-change material for the phase-change material layer 222L includes one or more layers of a binary system of Ga—Sb, In—Sb, In—Se, Sb—Te, Ge—Te, and Ge—Sb; a ternary system, of Ge—Sb—Te, In—Sb—Te, Ga—Se—Te, Sn—Sb—Te, In—Sb—Ge, and Ga—Sb—Te; a quaternary system of Ag—In—Sb—Te, Ge—Sn—Sb—Te, Ge—Sb—Se—Te, Te—Ge—Sb—S, Ge—Sb—Te—O, and Ge—Sb—Te—N; a chalcogenide alloy containing one or more elements from Group VI of the periodic table, a Ge—Sb—Te alloy, $Ge_2Sb_2Te_5$, tungsten oxide, nickel oxide, copper oxide, or combinations thereof. The phase-change material layer 222L may be formed by suitable deposition process, which may include one or more of a CVD process, a PVD process, an ALD process, an electroplating process, etc. Other suitable deposition processes are within the contemplated scope of disclosure. Then, a planarization process such as a CMP process or a mechanical grinding process is performed to level a top surface of the phase-change material layer 222L.

In some embodiments, a thickness of the phase-change material layer 222L may be in a range from approximately 5 nm to approximately 200 nm, such as from approximately 30 nm to approximately 100 nm, although other embodiments may include smaller and larger thicknesses. In some embodiments, a thickness of the phase-change material layer 222L may be in a range from approximately 10 nm to approximately 100 nm, such as from approximately 20 nm to approximately 50 nm, although other embodiments may include smaller and larger thicknesses.

The phase transition between the crystalline phase and the amorphous phase of the phase change material is related to the interplay between the long range order and the short range order of the structure of the phase change material. For example, collapse of the long range order generates the amorphous phase. The long range order in the crystalline phase facilitates electrical conduction, while the amorphous phase impedes electrical conduction and results in high electrical resistance. To tune the properties of the phase change material layer for different needs, the material of the phase change material layer may be doped with various elements at different amounts to adjust the proportion of the short range order and the long range order inside the bonding structure of the material. The doped element may be any element used for semiconductor doping through the use of, for example, ion implantation.

The second electrode layer 224L is subsequently formed over the phase-change material layer 222L. The second electrode layer 224L includes one or more layers of polysilicon, Al, Cu, Ti, Ta, W, Co, Mo, C, TiN, TaN, TiAl, TiAlN, WN, TaCN, TaC, TaSiN, AlCu, nickel silicide, cobalt silicide, or combinations thereof. In some embodiments, the second electrode layer 224L is made of TiN. The second electrode layer 224L may be formed by suitable deposition process, which may include one or more of a CVD process, a PVD process, an ALD process, an electroplating process, etc. Other suitable deposition processes are within the contemplated scope of disclosure. Then, a planarization process such as a CMP process or a mechanical grinding process is performed to level a top surface of the second electrode layer 224L. A thickness of the second electrode layer 224L may be in a range from approximately 5 nm to approximately 100 nm, such as from approximately 10 nm to approximately 30 nm, although other embodiments may include smaller and larger thicknesses.

The hard mask layer 226L may be formed of silicon nitride, silicon oxynitride, silicon oxide, silicon oxy-carbonitride, or the like. The hard mask layer 226L may be formed by suitable deposition process, which may include one or more of a CVD process, a PVD process, an ALD process, an electroplating process, etc. Other suitable deposition processes are within the contemplated scope of disclosure. Then, a planarization process such as a CMP process or a mechanical grinding process is performed to level a top surface of the hard mask layer 226L. A thickness of the hard mask layer 226L may be in a range from approximately 5 nm to approximately 100 nm, such as from approximately 10 nm to approximately 30 nm, although other embodiments may include smaller and larger thicknesses.

Figure 2D:
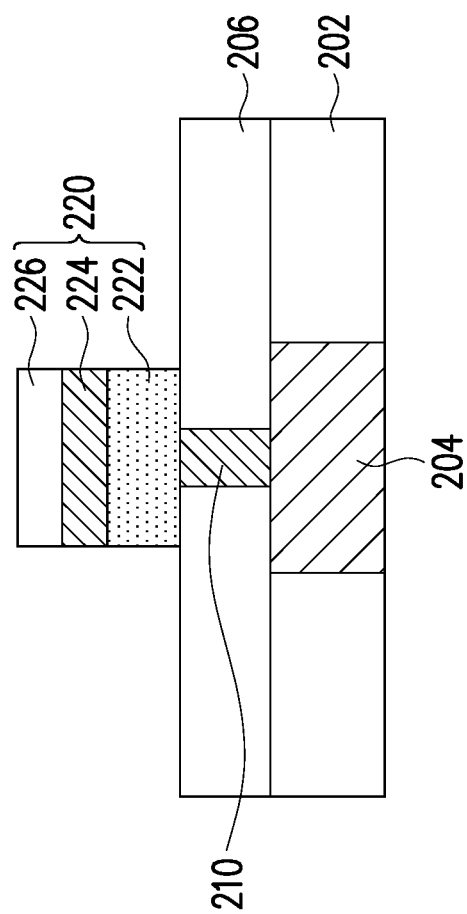

Referring to FIG. 2D, the phase-change material layer 222L, the second electrode layer 224L and the hard mask layer 226L are partially removed by an etching process, to form a stack 220 on the first electrode 210. As a result, a portion of the second dielectric layer 206 is revealed. In some embodiments, a photoresist (not shown) is formed over the phase-change material layer 222L, the second electrode layer 224L and the hard mask layer 226L. The photoresist may then be patterned using photolithography techniques to generate an opening in the photoresist. The patterned photoresist may then be used as a mask for patterning the phase-change material layer 222L, the second electrode layer 224L and the hard mask layer 226L. In this regard, an anisotropic etch process may be performed to remove a region of the phase-change material layer 222L, the second electrode layer 224L, and the hard mask layer 226L to form the stack 220 comprising a phase-change layer 222, a second electrode 224 on the phase-change layer 222 and a hard mask 226 disposed on the second electrode 224. After performing the removal process (e.g., an anisotropic etch process), any residual photoresist is removed by an ash process or by dissolution with a solvent.

In some embodiments, the stack 220 may include vertical sidewalls. In other words, the sidewalls of the stack 220 may be substantially vertical to a top surface of the first electrode 210. In some embodiments, the top surface of the first electrode 210 may locate at X-Y plane (Y is not shown, referring to FIG. 1). In some embodiments, as illustrated in FIG. 2D, an included angle between the sidewall of the stack 220 and the top surface of the first electrode 210 is about 90 degrees.

Figure 2E:
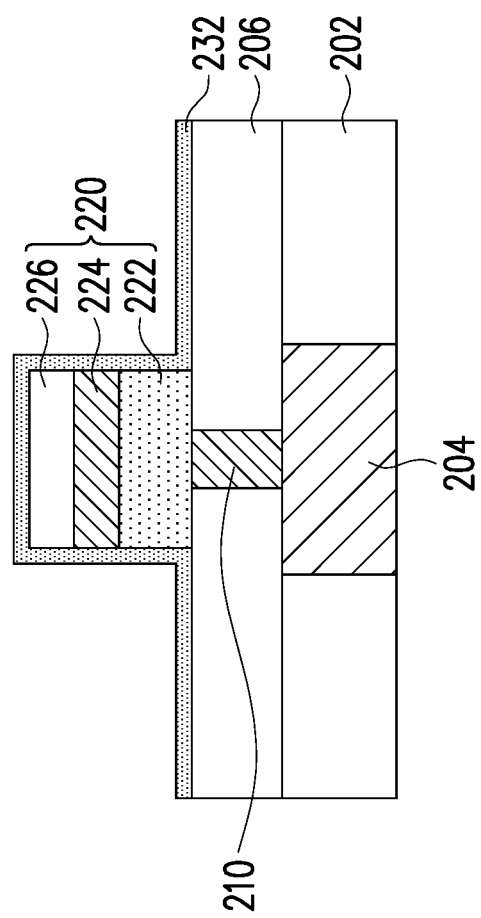

Referring to FIG. 2E, a first nitride layer 232 is deposited to cover the stack 220 and the second dielectric layer 206. In some embodiments, the first nitride layer 232 is conformally deposited to cover the stack 220 and the second dielectric layer 206. In some embodiments, the first nitride layer 232 is deposited to cover a top surface of the hard mask 226 of the stack 220 and sidewalls of the phase-change layer 222, the second electrode 224 and the hard mask 226. The first nitride layer 232 may be formed by suitable deposition process, which may include one or more of a CVD process, a PVD process, an ALD process, an electroplating process, etc. Other suitable deposition processes are within the contemplated scope of disclosure.

In some embodiments, the first nitride layer 232 is formed of a dielectric material such as silicon nitride (SiN), or the like. A thickness of the first nitride layer 232 may be in a range from approximately 1 nm to approximately 10 nm, such as from approximately 3 nm to approximately 8 nm, although other embodiments may include smaller and larger thicknesses. The first nitride layer 232 has a first top portion covering a top surface of the stack 220 and a first sidewall portion covering a sidewall of the stack 220. A thickness ratio of the first sidewall portion to the first top portion ranges from about 0.65 to about 0.8.

Figure 2F:
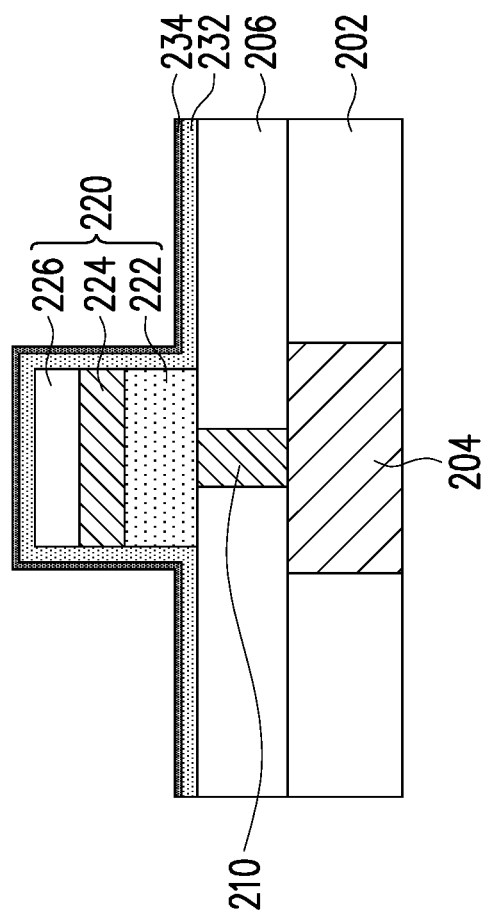

Referring to FIG. 2F, a first oxide layer 234 is deposited on the first nitride layer 232. In some embodiments, the first oxide layer 234 is conformally deposited to cover the first nitride layer 232. In some embodiments, an Ar etching process is performed on the first nitride layer 232, then an $O_2$ plasma treatment is performed on a surface of the first nitride layer 232 to form the first oxide layer 234.

In some embodiments, the first oxide layer 234 is formed of a dielectric material such as silicon oxide ($SiO_2$), silicon oxynitride (SiON), or the like. In some embodiments, the first oxide layer 234 is formed of a dielectric material such as silicon oxynitride (SiON), or the like. In some embodiments, a thickness of the first oxide layer 234 may be less than 2 nm. In some embodiments, a thickness of the first oxide layer 234 may be in a range from approximately 0.5 nm to approximately 5 nm, such as from approximately 1 nm to approximately 3 nm. The first oxide layer 234 has second top portion covering the first top portion of the first nitride layer 232, and a second sidewall portion covering the first sidewall portion of the first nitride layer 232. A thickness ratio of the second sidewall portion to the second top portion ranges from about 0.88 to about 1.

In some embodiments, a multi-layered spacer comprises the first nitride layer 232 and the first oxide layer 234. A first portion of the multi-layered spacer covers a top surface of the stack 220, and a second portion of the multi-layered spacer covers a sidewall of the stack 220. In some embodiments, a thickness ratio of the second portion to the first portion ranges from about 0.67 to about 0.82.

Figure 2G:
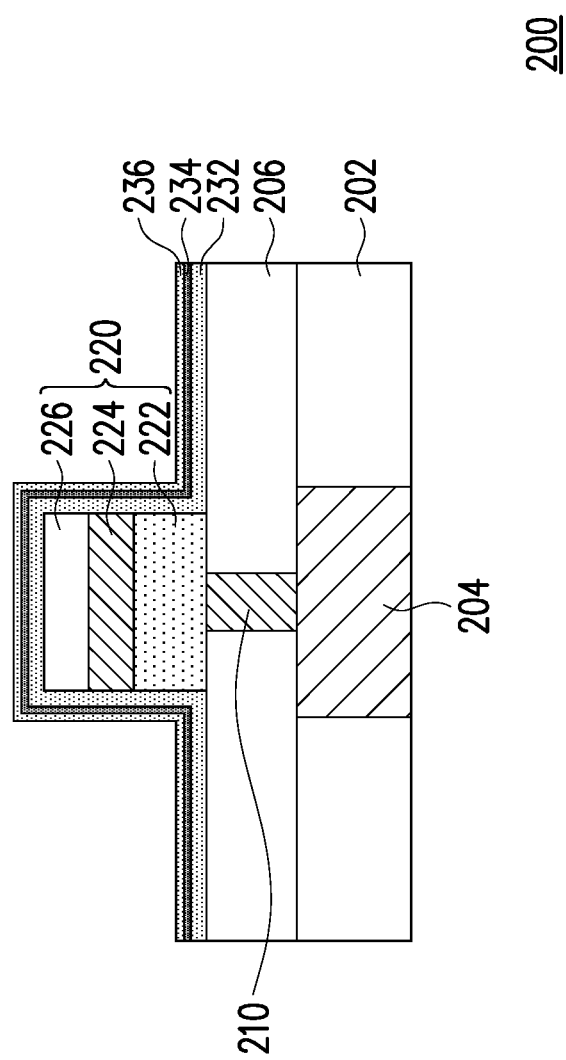

Referring to FIG. 2G, a second nitride layer 236 is deposited on the first oxide layer 234. In some embodiments, the second nitride layer 236 is conformally deposited to cover the first oxide layer 234. The second nitride layer 236 may be formed by suitable deposition process, which may include one or more of a CVD process, a PVD process, an ALD process, an electroplating process, etc. Other suitable deposition processes are within the contemplated scope of disclosure.

In some embodiments, the second nitride layer 236 is formed of a dielectric material such as silicon nitride (SiN), or the like. A thickness of the second nitride layer 236 may be in a range from approximately 1 nm to approximately 10 nm, such as from approximately 3 nm to approximately 8 nm, although other embodiments may include smaller and larger thicknesses. The second nitride layer 236 has a third top portion covering the second top portion of the first oxide layer 234, and a third sidewall portion covering the second sidewall portion of the first oxide layer 234. A thickness ratio of the third sidewall portion to the third top portion ranges from about 0.7 to about 0.81.

In some embodiments, a multi-layered spacer comprises the first nitride layer 232, the first oxide layer 234 and the second nitride layer 236. A first portion of the multi-layered spacer covers a top surface of the stack 220, and a second portion of the multi-layered spacer covers a sidewall of the stack 220. A thickness ratio of the second portion to the first portion ranges from about 0.67 to about 0.85. A thickness of the first portion may be in a range from approximately 8 nm to approximately 15 nm, such as from approximately 10 nm to approximately 12 nm, although other embodiments may include smaller and larger thicknesses. A thickness of the second portion may be in a range from approximately 6 nm to approximately 13 nm, such as from approximately 6.8 nm to approximately 10.2 nm, although other embodiments may include smaller and larger thicknesses.

In some embodiments, a transistor structure 200 is formed after depositing the second nitride layer 236. The transistor structure 200 may be a phase-change memory device such as a PCRAM or the like. The transistor structure 200 includes the first electrode 210, the stack 220 (comprising the phase-change layer 222, the second electrode 224 and the hard mask 226), and the multi-layered spacer (comprising the first nitride layer 232, the first oxide layer 234 and the second nitride layer 236). In some embodiments, the transistor structure 200 is embedded in the interconnect structure of a semiconductor die. In some embodiments, the transistor structure 200 is in the interconnect structure over the field effect transistors 108 (referring to FIG. 1).

Figure 3:
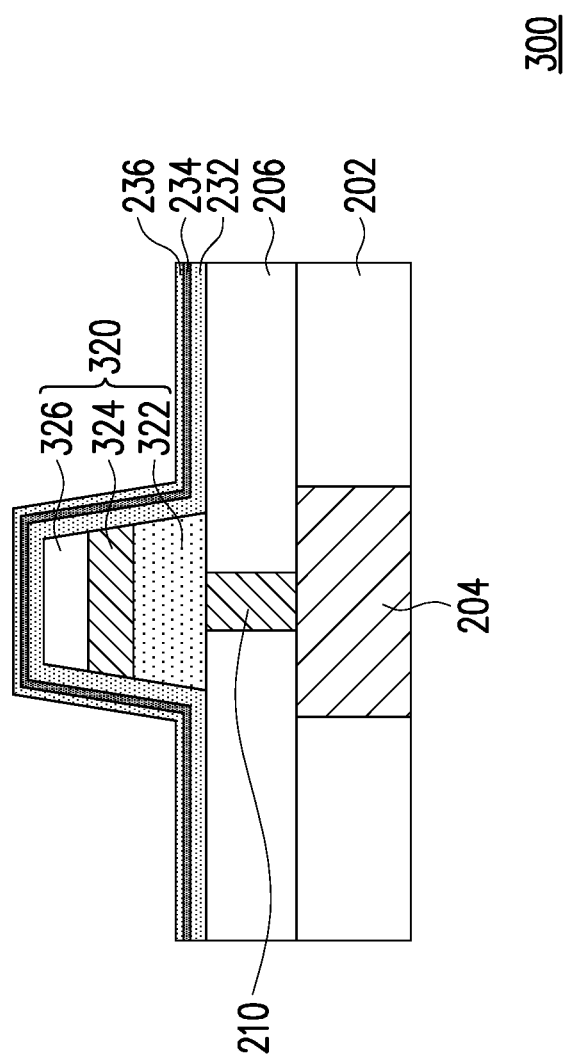
FIG. 3 illustrates a phase-change memory device in accordance with some embodiments.

FIG. 3 illustrates a phase-change memory device in accordance with some embodiments.

Referring to FIG. 3, a transistor structure 300 is formed after depositing the second nitride layer 236. Unless specific description, the definition of the reference symbols is the same as the definition the corresponding reference symbols of FIG. 2A to FIG. 2G, and will not be repeated herein. The transistor structure 300 may be a phase-change memory device such as a PCRAM or the like. The transistor structure 300 includes the first electrode 210, a stack 320 (comprising a phase-change layer 322, a second electrode 324 and a hard mask 326), a multi-layered spacer (comprising the first nitride layer 232, the first oxide layer 234 and the second nitride layer 236). In some embodiments, the transistor structure 300 is embedded in the interconnect structure of a semiconductor die. In some embodiments, the transistor structure 300 is in the interconnect structure over the field effect transistors 108.

The phase-change material layer 222L, the second electrode layer 224L and the hard mask layer 226L are partially removed by an etching process, to form a stack 320 on the first electrode 210. As a result, a portion of the second dielectric layer 206 is revealed. In some embodiments, a top surface of the first electrode 210 may locate at X-Y plane (Y is not shown, referring to FIG. 1). An included angle between a sidewall of the stack 320 and the top surface of the first electrode 210 is greater than about 90 degrees. Then, the first nitride layer 232 is deposited (i.e., conformally deposited) to cover the stack 320, the first oxide layer 234 is deposited on the first nitride layer 232 and the second nitride layer 236 is deposited on the first oxide layer 234 in an order, to form the multi-layered spacer. A first portion of the multi-layered spacer covers a top surface of the stack 320, and a second portion of the multi-layered spacer covers a sidewall of the stack 320. A thickness ratio of the second portion to the first portion ranges from about 0.67 to about 0.85.

In some embodiments, a thickness of the first portion may be in a range from approximately 8 nm to approximately 15 nm, such as from approximately 10 nm to approximately 12 nm, although other embodiments may include smaller and larger thicknesses. A thickness of the second portion may be in a range from approximately 6 nm to approximately 13 nm, such as from approximately 6.8 nm to approximately 10.2 nm, although other embodiments may include smaller and larger thicknesses.

Figure 4:
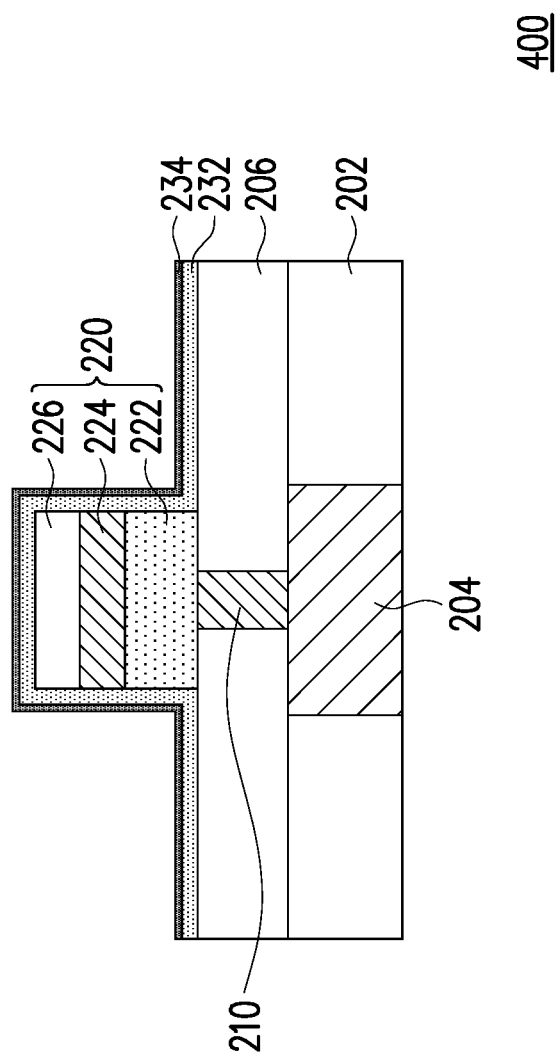
FIG. 4 illustrates a phase-change memory device in accordance with some embodiments.

FIG. 4 illustrates a phase-change memory device in accordance with some embodiments.

Referring to FIG. 4, a transistor structure 400 is formed after depositing a first oxide layer 234. Unless specific description, the definition of the reference symbols is the same as the definition the corresponding reference symbols of FIG. 2A to FIG. 2F, and will not be repeated herein. The transistor structure 400 may be a phase-change memory device such as a PCRAM or the like. The transistor structure 400 includes the first electrode 210, a stack 220 (comprising a phase-change layer 222, a second electrode 224 and a hard mask 226), and a multi-layered spacer (comprising a first nitride layer 232 and the first oxide layer 234). In some embodiments, the transistor structure 400 is embedded in the interconnect structure of a semiconductor die. In some embodiments, the transistor structure 400 is in the interconnect structure over the field effect transistors 108.

The phase-change material layer 222L, the second electrode layer 224L and the hard mask layer 226L are partially removed by an etching process, to form the stack 220 on the first electrode 210. As a result, a portion of the second dielectric layer 206 is revealed. In some embodiments, the stack 220 may include vertical sidewalls. In other words, the sidewalls of the stack 220 may be substantially vertical to a top surface of the first electrode 210. In some embodiments, the top surface of the first electrode 210 may locate at X-Y plane (Y is not shown). In some embodiments, as illustrated in FIG. 4, an included angle between the sidewall of the stack 220 and the top surface of the first electrode 210 is about 90 degrees.

In some embodiments, the first nitride layer 232 is deposited to cover a top surface of the hard mask 226 of the stack 220 and sidewalls of the phase-change layer 222, the second electrode 224 and the hard mask 226 (referring to FIG. 2E). The first nitride layer 232 may be formed by suitable deposition process, which may include one or more of a CVD process, a PVD process, an ALD process, an electroplating process, etc. Other suitable deposition processes are within the contemplated scope of disclosure.

In some embodiments, the first nitride layer 232 is formed of a dielectric material such as silicon nitride (SiN), or the like. A thickness of the first nitride layer 232 may be in a range from approximately 1 nm to approximately 10 nm, such as from approximately 3 nm to approximately 8 nm, although other embodiments may include smaller and larger thicknesses. The first nitride layer 232 has a first top portion covering a top surface of the stack 220 and a first sidewall portion covering a sidewall of the stack 220. A thickness ratio of the first sidewall portion to the first top portion ranges from about 0.65 to about 0.8.

The first oxide layer 234 is deposited on the first nitride layer 232 (referring to FIG. 2F). In some embodiments, the first oxide layer 234 is conformally deposited to cover the first nitride layer 232. In some embodiments, an Ar etching process is performed on the first nitride layer 232, then an $O_2$ plasma treatment is performed on a surface of the first nitride layer 232 to form the first oxide layer 234.

In some embodiments, the first oxide layer 234 is formed of a dielectric material such as silicon oxide ($SiO_2$), silicon oxynitride (SiON), or the like. In some embodiments, the first oxide layer 234 is formed of a dielectric material such as silicon oxynitride (SiON), or the like. In some embodiments, a thickness of the first oxide layer 234 may be less than 2 nm. In some embodiments, a thickness of the first oxide layer 234 may be in a range from approximately 0.5 nm to approximately 5 nm, such as from approximately 1 nm to approximately 3 nm. The first oxide layer 234 has second top portion covering the first top portion of the first nitride layer 232, and a second sidewall portion covering the first sidewall portion of the first nitride layer 232. A thickness ratio of the second sidewall portion to the second top portion ranges from about 0.88 to about 1.

In some embodiments, a multi-layered spacer comprises the first nitride layer 232 and the first oxide layer 234. A first portion of the multi-layered spacer covers a top surface of the stack 220, and a second portion of the multi-layered spacer covers a sidewall of the stack 220. In some embodiments, a thickness ratio of the second portion to the first portion ranges from about 0.67 to about 0.85.

In some embodiments, a thickness of the first portion may be in a range from approximately 8 nm to approximately 15 nm, such as from approximately 10 nm to approximately 12 nm, although other embodiments may include smaller and larger thicknesses. A thickness of the second portion may be in a range from approximately 6 nm to approximately 13 nm, such as from approximately 6.8 nm to approximately 10.2 nm, although other embodiments may include smaller and larger thicknesses.

Figure 5:
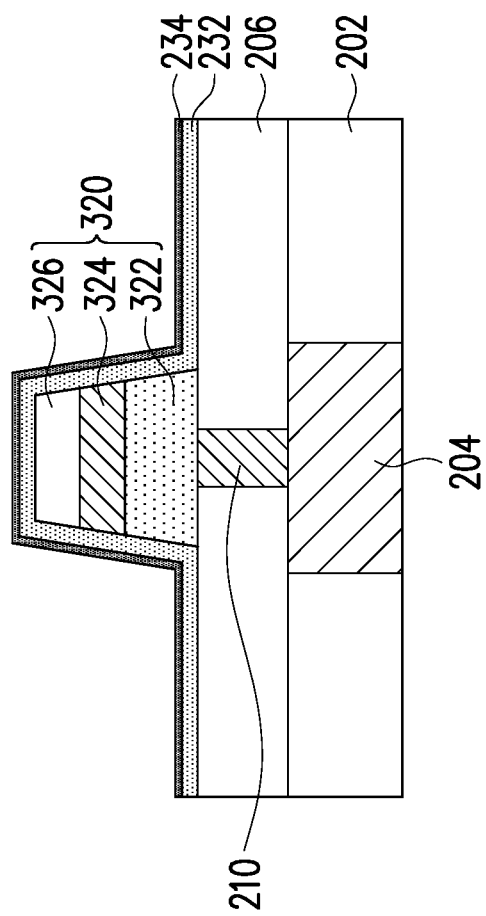
FIG. 5 illustrates a phase-change memory device in accordance with some embodiments.

FIG. 5 illustrates a phase-change memory device in accordance with some embodiments.

Referring to FIG. 5, a transistor structure 500 is formed after depositing the first oxide layer 234. Unless specific description, the definition of the reference symbols is the same as the definition the corresponding reference symbols of FIG. 2A to FIG. 2G and FIG. 4, and will not be repeated herein. The transistor structure 500 may be a phase-change memory device such as a PCRAM or the like. The transistor structure 500 includes the first electrode 210, a stack 320 (comprising a phase-change layer 322, a second electrode 324 and a hard mask 326), and a multi-layered spacer (comprising the first nitride layer 232 and the first oxide layer 234). In some embodiments, the transistor structure 500 is embedded in the interconnect structure of a semiconductor die. In some embodiments, the transistor structure 500 is in the interconnect structure over the field effect transistors 108.

The phase-change material layer 222L, the second electrode layer 224L and the hard mask layer 226L are partially removed by an etching process, to form a stack 320 on the first electrode 210. As a result, a portion of the second dielectric layer 206 is revealed. In some embodiments, a top surface of the first electrode 210 may locate at X-Y plane (Y is not shown, referring to FIG. 1). An included angle between a sidewall of the stack 320 and the top surface of the first electrode 210 is greater than about 90 degrees. Then, the first nitride layer 232 is deposited (i.e., conformally deposited) to cover the stack 320 and the first oxide layer 234 is deposited on the first nitride layer 232 in an order, to form the multi-layered spacer. A first portion of the multi-layered spacer covers a top surface of the stack 320, and a second portion of the multi-layered spacer covers a sidewall of the stack 320. In some embodiments, a thickness ratio of the second portion to the first portion ranges from about 0.67 to about 0.85.

In some embodiments, a thickness of the first portion may be in a range from approximately 8 nm to approximately 15 nm, such as from approximately 10 nm to approximately 12 nm, although other embodiments may include smaller and larger thicknesses. A thickness of the second portion may be in a range from approximately 6 nm to approximately 13 nm, such as from approximately 6.8 nm to approximately 10.2 nm, although other embodiments may include smaller and larger thicknesses.

Figure 6:
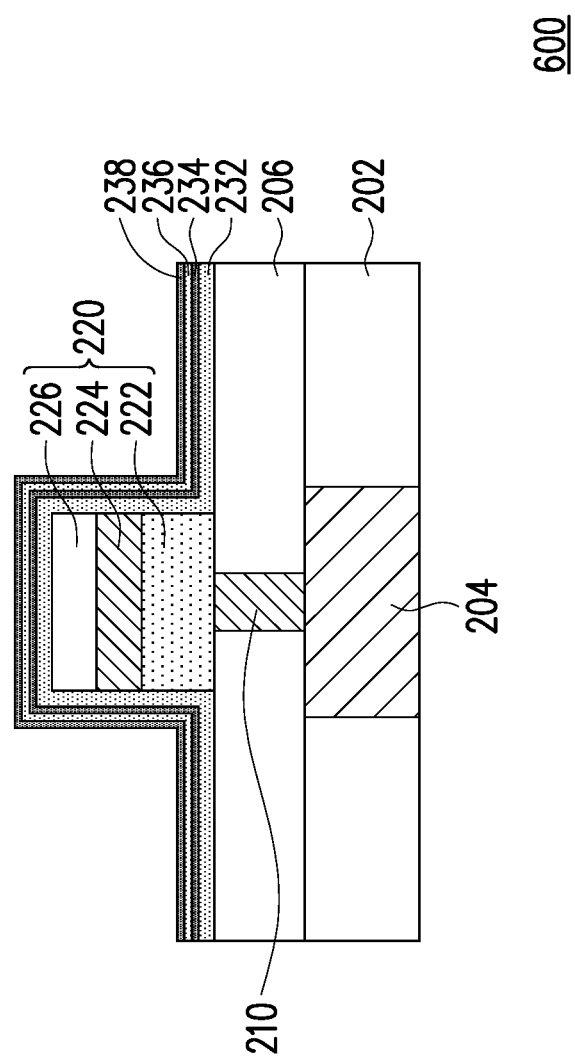
FIG. 6 illustrates a phase-change memory device in accordance with some embodiments.

FIG. 6 illustrates a phase-change memory device in accordance with some embodiments.

Referring to FIG. 6, a transistor structure 600 is formed after depositing a second oxide layer 238. Unless specific description, the definition of the reference symbols is the same as the definition the corresponding reference symbols of FIG. 2A to FIG. 2G, and will not be repeated herein. The transistor structure 600 may be a phase-change memory device such as a PCRAM or the like. The transistor structure 600 includes the first electrode 210, a stack 220 (comprising a phase-change layer 222, a second electrode 224 and a hard mask 226), and a multi-layered spacer (comprising the first nitride layer 232, the first oxide layer 234, the second nitride layer 236 and the second oxide layer 238). In some embodiments, the transistor structure 600 is embedded in the interconnect structure of a semiconductor die. In some embodiments, the transistor structure 600 is in the interconnect structure over the field effect transistors 108.

The phase-change material layer 222L, the second electrode layer 224L and the hard mask layer 226L are partially removed by an etching process, to form the stack 220 on the first electrode 210. As a result, a portion of the second dielectric layer 206 is revealed. In some embodiments, the stack 220 may include vertical sidewalls. In other words, the sidewalls of the stack 220 may be substantially vertical to a top surface of the first electrode 210. In some embodiments, the top surface of the first electrode 210 may locate at X-Y plane (Y is not shown). In some embodiments, as illustrated in FIG. 6, an included angle between the sidewall of the stack 220 and the top surface of the first electrode 210 is about 90 degrees.

Then, the first nitride layer 232 is deposited (i.e., conformally deposited) to cover the stack 220, the first oxide layer 234 is deposited on the first nitride layer 232, the second nitride layer 236 is deposited on the first oxide layer 234, and the second oxide layer 238 is deposited on the second nitride layer 236 in an order, to form the multi-layered spacer. In some embodiments, the second oxide layer 238 is conformally deposited to cover the second nitride layer 236. In some embodiments, an Ar etching process is performed on the second nitride layer 236, then an $O_2$ plasma treatment is performed on a surface of the second nitride layer 236 to form the second oxide layer 238.

In some embodiments, the second oxide layer 238 is formed of a dielectric material such as silicon oxide ($SiO_2$), silicon oxynitride (SiON), or the like. In some embodiments, the second oxide layer 238 is formed of a dielectric material such as silicon oxynitride (SiON), or the like. In some embodiments, a thickness of the second oxide layer 238 may be less than 2 nm. In some embodiments, a thickness of the second oxide layer 238 may be in a range from approximately 0.5 nm to approximately 5 nm, such as from approximately 1 nm to approximately 3 nm, although other embodiments may include smaller and larger thicknesses. The second oxide layer 238 has a fourth top portion covering the third top portion of the second nitride layer 236 and a fourth sidewall portion covering the third sidewall portion of the second nitride layer 236. A thickness ratio of the fourth sidewall portion to the fourth top portion ranges from about 0.88 to about 1.0.

In some embodiments, a first portion of the multi-layered spacer covers a top surface of the stack 220, and a second portion of the multi-layered spacer covers a sidewall of the stack 220. In some embodiments, a thickness ratio of the second portion to the first portion ranges from about 0.67 to about 0.85.

In some embodiments, a thickness of the first portion may be in a range from approximately 8 nm to approximately 15 nm, such as from approximately 10 nm to approximately 12 nm, although other embodiments may include smaller and larger thicknesses. A thickness of the second portion may be in a range from approximately 6 nm to approximately 13 nm, such as from approximately 6.8 nm to approximately 10.2 nm, although other embodiments may include smaller and larger thicknesses.

Figure 7:
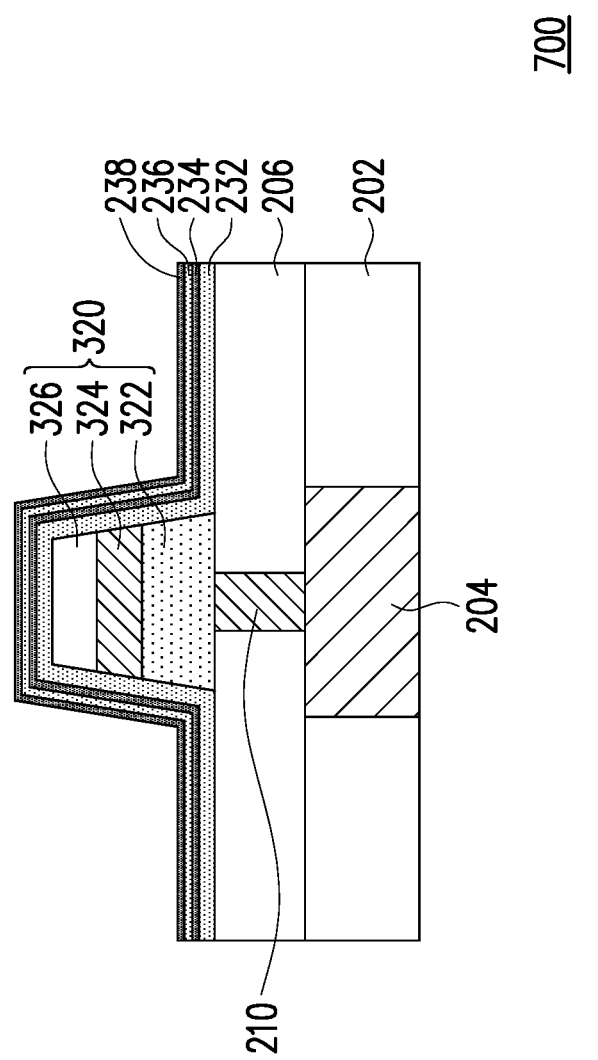
FIG. 7 illustrates a phase-change memory device in accordance with some embodiments.

FIG. 7 illustrates a phase-change memory device in accordance with some embodiments.

Referring to FIG. 7, a transistor structure 700 is formed after depositing the second oxide layer 238. Unless specific description, the definition of the reference symbols is the same as the definition the corresponding reference symbols of FIG. 2A to FIG. 2G and FIG. 6, and will not be repeated herein. The transistor structure 700 may be a phase-change memory device such as a PCRAM or the like. The transistor structure 700 includes the first electrode 210, a stack 320 (comprising a phase-change layer 322, a second electrode 324 and a hard mask 326), and a multi-layered spacer (comprising the first nitride layer 232, the first oxide layer 234, the second nitride layer 236 and the second oxide layer 238). In some embodiments, the transistor structure 700 is embedded in the interconnect structure of a semiconductor die. In some embodiments, the transistor structure 700 is in the interconnect structure over the field effect transistors 108.

The phase-change material layer 222L, the second electrode layer 224L and the hard mask layer 226L are partially removed by an etching process, to form a stack 320 on the first electrode 210. As a result, a portion of the second dielectric layer 206 is revealed. In some embodiments, a top surface of the first electrode 210 may locate at X-Y plane (Y is not shown, referring to FIG. 1). An included angle between a sidewall of the stack 320 and the top surface of the first electrode 210 is greater than about 90 degrees. In some embodiments, a thickness of the second oxide layer 238 may be less than 2 nm. In some embodiments, a thickness of the second oxide layer 238 may be in a range from approximately 0.5 nm to approximately 5 nm, such as from approximately 1 nm to approximately 3 nm, although other embodiments may include smaller and larger thicknesses. The second oxide layer 238 has a fourth top portion covering the third top portion of the second nitride layer 236 and a fourth sidewall portion covering the third sidewall portion of the second nitride layer 236. A thickness ratio of the fourth sidewall portion to the fourth top portion ranges from about 0.88 to about 1.0.

Then, the first nitride layer 232 is deposited (i.e., conformally deposited) to cover the stack 320, the first oxide layer 234 is deposited on the first nitride layer 232, the second nitride layer 236 is deposited on the first oxide layer 234, and the second oxide layer 238 is deposited on the second nitride layer 236 in an order, to form the multi-layered spacer. A first portion of the multi-layered spacer covers a top surface of the stack 320, and a second portion of the multi-layered spacer covers a sidewall of the stack 320. A thickness ratio of the second portion to the first portion ranges from about 0.67 to about 0.85.

In some embodiments, a thickness of the first portion may be in a range from approximately 8 nm to approximately 15 nm, such as from approximately 10 nm to approximately 12 nm, although other embodiments may include smaller and larger thicknesses. A thickness of the second portion may be in a range from approximately 6 nm to approximately 13 nm, such as from approximately 6.8 nm to approximately 10.2 nm, although other embodiments may include smaller and larger thicknesses.

Figure 8:
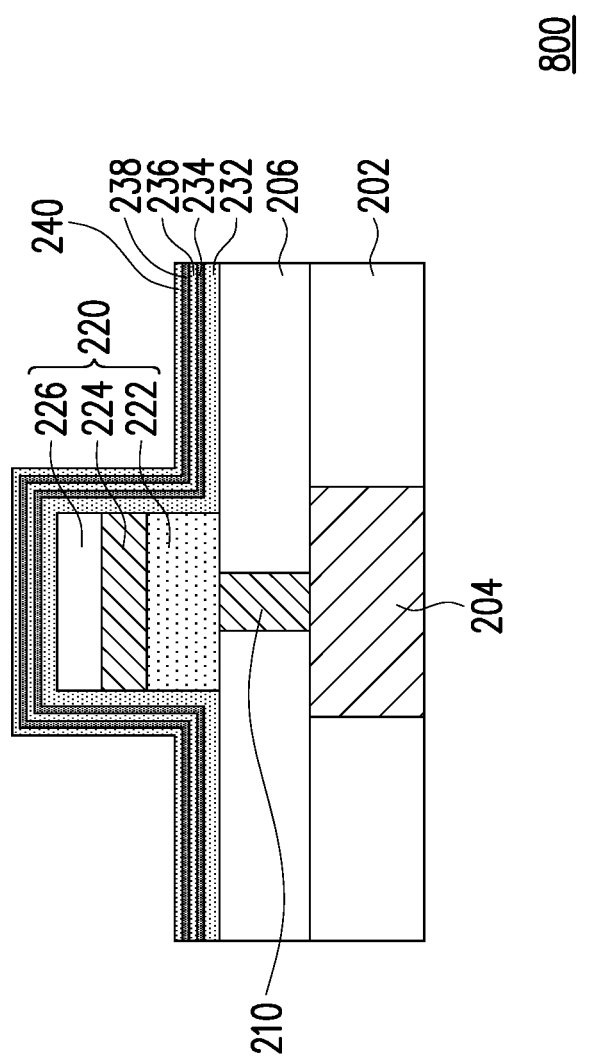
FIG. 8 illustrates a phase-change memory device in accordance with some embodiments.

FIG. 8 illustrates a phase-change memory device in accordance with some embodiments.

Referring to FIG. 8, a transistor structure 800 is formed after depositing a third nitride layer 240. Unless specific description, the definition of the reference symbols is the same as the definition the corresponding reference symbols of FIG. 2A to FIG. 2G, and will not be repeated herein. The transistor structure 800 may be a phase-change memory device such as a PCRAM or the like. The transistor structure 800 includes the first electrode 210, a stack 220 (comprising a phase-change layer 222, a second electrode 224 and a hard mask 226), and the multi-layered spacer (comprising the first nitride layer 232 and the first oxide layer 234, the second nitride layer 236, the second oxide layer 238, and the third nitride layer 240). In some embodiments, the transistor structure 800 is embedded in the interconnect structure of a semiconductor die. In some embodiments, the transistor structure 800 is in the interconnect structure over the field effect transistors 108.

The phase-change material layer 222L, the second electrode layer 224L and the hard mask layer 226L are partially removed by an etching process, to form the stack 220 on the first electrode 210. As a result, a portion of the second dielectric layer 206 is revealed. In some embodiments, the stack 220 may include vertical sidewalls. In other words, the sidewalls of the stack 220 may be substantially vertical to a top surface of the first electrode 210. In some embodiments, the top surface of the first electrode 210 may locate at X-Y plane (Y is not shown). In some embodiments, as illustrated in FIG. 8, an included angle between the sidewall of the stack 220 and the top surface of the first electrode 210 is about 90 degrees.

Then, the first nitride layer 232 is deposited (i.e., conformally deposited) to cover the stack 220, the first oxide layer 234 is deposited on the first nitride layer 232, the second nitride layer 236 is deposited on the first oxide layer 234, the second oxide layer 238 is deposited on the second nitride layer 236, and the third nitride layer 240 is deposited on the second oxide layer 238 in an order, to form the multi-layered spacer. In some embodiments, the third nitride layer 240 is conformally deposited to cover the second oxide layer 238. In some embodiments, an Ar etching process is performed on the second oxide layer 238, then an O₂ plasma treatment is performed on a surface of the second oxide layer 238 to form the third nitride layer 240.

In some embodiments, the third nitride layer 240 is formed of a dielectric material such as silicon nitride (SiN), or the like. In some embodiments, a thickness of the third nitride layer 240 may be in a range from approximately 1 nm to approximately 10 nm, such as from approximately 3 nm to approximately 8 nm, although other embodiments may include smaller and larger thicknesses. The third nitride layer 240 has a fifth top portion covering the fourth top portion of the second oxide layer 238 and a fifth sidewall portion covering the fourth sidewall portion of the second oxide layer 238. A thickness ratio of the fifth sidewall portion to the fifth top portion ranges from about 0.7 to about 0.81.

In some embodiments, a first portion of the multi-layered spacer covers a top surface of the stack 220, and a second portion of the multi-layered spacer covers a sidewall of the stack 220. In some embodiments, a thickness ratio of the second portion to the first portion ranges from about 0.67 to about 0.85.

In some embodiments, a thickness of the first portion may be in a range from approximately 8 nm to approximately 15 nm, such as from approximately 10 nm to approximately 12 nm, although other embodiments may include smaller and larger thicknesses. A thickness of the second portion may be in a range from approximately 6 nm to approximately 13 nm, such as from approximately 6.8 nm to approximately 10.2 nm, although other embodiments may include smaller and larger thicknesses.

Figure 9:
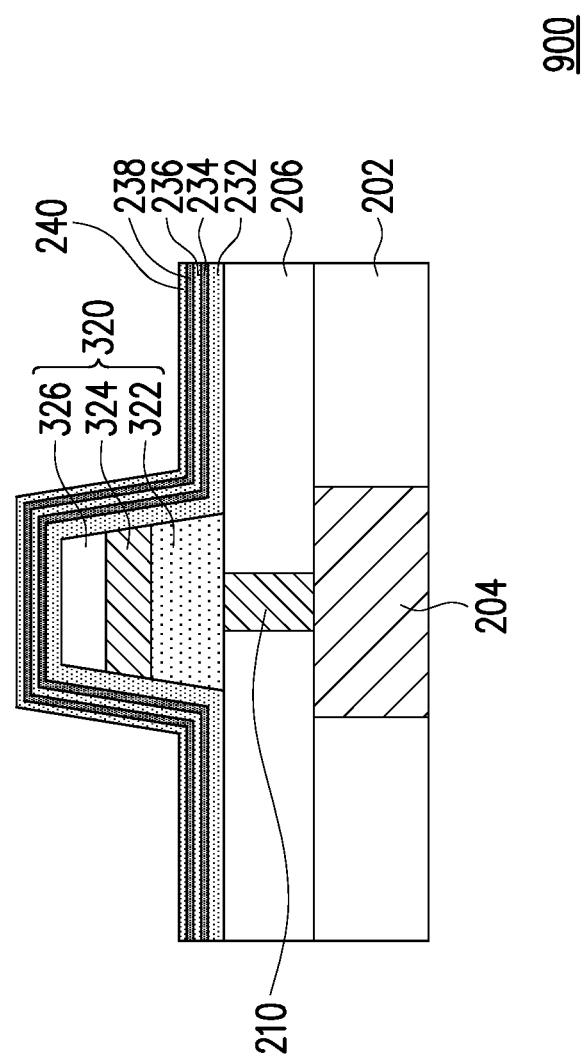
FIG. 9 illustrates a phase-change memory device in accordance with some embodiments.

FIG. 9 illustrates a phase-change memory device in accordance with some embodiments.

Referring to FIG. 9, a transistor structure 900 is formed after depositing the third nitride layer 240. Unless specific description, the definition of the reference symbols is the same as the definition the corresponding reference symbols of FIG. 2A to FIG. 2G and FIG. 8, and will not be repeated herein. The transistor structure 900 may be a phase-change memory device such as a PCRAM or the like. The transistor structure 900 includes the first electrode 210, a stack 320 (comprising a phase-change layer 322, a second electrode 324 and a hard mask 326), and the multi-layered spacer (comprising the first nitride layer 232 and the first oxide layer 234, the second nitride layer 236, the second oxide layer 238, and the third nitride layer 240). In some embodiments, the transistor structure 900 is embedded in the interconnect structure of a semiconductor die. In some embodiments, the transistor structure 900 is in the interconnect structure over the field effect transistors 108.

The phase-change material layer 222L, the second electrode layer 224L and the hard mask layer 226L are partially removed by an etching process, to form a stack 320 on the first electrode 210. As a result, a portion of the second dielectric layer 206 is revealed. In some embodiments, a top surface of the first electrode 210 may locate at X-Y plane (Y is not shown, referring to FIG. 1). An included angle between a sidewall of the stack 320 and the top surface of the first electrode 210 is greater than about 90 degrees. Then, the first nitride layer 232 is deposited (i.e., conformally deposited) to cover the stack 320, the first oxide layer 234 is deposited on the first nitride layer 232, the second nitride layer 236 is deposited on the first oxide layer 234, the second oxide layer 238 is deposited on the second nitride layer 236, and the third nitride layer 240 is deposited on the second oxide layer 238 in an order, to form the multi-layered spacer.

In some embodiments, a thickness of the third nitride layer 240 may be in a range from approximately 1 nm to approximately 10 nm, such as from approximately 3 nm to approximately 8 nm, although other embodiments may include smaller and larger thicknesses. The third nitride layer 240 has a fifth top portion covering the fourth top portion of the second oxide layer 238 and a fifth sidewall portion covering the fourth sidewall portion of the second oxide layer 238. A thickness ratio of the fifth sidewall portion to the fifth top portion ranges from about 0.7 to about 0.81.

In some embodiments, a first portion of the multi-layered spacer covers a top surface of the stack 320, and a second portion of the multi-layered spacer covers a sidewall of the stack 320. In some embodiments, a thickness ratio of the second portion to the first portion ranges from about 0.67 to about 0.85.

In some embodiments, a thickness of the first portion may be in a range from approximately 8 nm to approximately 15 nm, such as from approximately 10 nm to approximately 12 nm, although other embodiments may include smaller and larger thicknesses. A thickness of the second portion may be in a range from approximately 6 nm to approximately 13 nm, such as from approximately 6.8 nm to approximately 10.2 nm, although other embodiments may include smaller and larger thicknesses.

A phase-change memory device and a method for fabricating the same are provided. The embodiments of the present disclosure have some advantageous features. In accordance with some embodiments of the present disclosure, the multi-layered spacer covers the stack of the phase-change layer, the electrode and the hard mask. The first portion of the multi-layered spacer covers the top surface of the stack, and the second portion of the multi-layered spacer covers the sidewall of the stack. The multi-layered spacer at least comprises at least one nitride layer and at least one oxide layer. The formation of the multi-layered spacer is by sequentially and alternately depositing the nitride layer and performing an $O_2$ plasma treatment on the surface of the first nitride layer to form the oxide layer. A health phase-change memory device can be obtained by increasing a ratio of the second portion of the multi-layered spacer to the first portion of the multi-layered spacer to prevent the phase-change layer damage, and preventing the moisture from the phase-change memory device and improving the nitride layer adhesion by the oxide layer. Therefore, a performance of the phase-change memory device is improved.

In accordance with some embodiments of the present disclosure, a phase-change memory device is embedded in an interconnect structure of a semiconductor die. The phase-change memory device comprises a first electrode, a stack and a multi-layered spacer. The first electrode is disposed on and electrically connected to an interconnect wiring of the interconnect structure. The stack is disposed on the first electrode and comprises a phase-change layer disposed on the first electrode and a second electrode disposed on the phase-change layer. The multi-layered spacer covers the stack. A first portion of the multi-layered spacer covers a top surface of the stack, and a second portion of the multi-layered spacer covers a sidewall of the stack.

In accordance with some embodiments of the present disclosure, a phase-change memory device is in an interconnect structure over transistors. The phase-change memory device comprises a first electrode, a phase-change layer, a second electrode, a hard mask and a multi-layered spacer. The first electrode is disposed on and electrically connected to an interconnect wiring of the interconnect structure. The phase-change layer is disposed on the first electrode. The second electrode is disposed on the phase-change layer. The hard mask is disposed on the second electrode. The multi-layered spacer covers a stack of the phase-change layer, the second electrode and the hard mask. A first portion of the multi-layered spacer covers a top surface of the stack, and a second portion of the multi-layered spacer covers a sidewall of the stack.

In accordance with some embodiments of the present disclosure, A method for fabricating a phase-change memory device embedded in an interconnect structure of a semiconductor die comprises forming a first electrode on an interconnect wiring of the interconnect structure; forming a phase-change material layer on the first electrode; forming a second electrode layer on the phase-change material layer; forming a hard mask layer on the second electrode layer; etching the phase-change material layer, the second electrode layer and the hard mask layer to form a stack of a phase-change layer, a second electrode and a hard mask; and depositing a multi-layered spacer to cover the stack. A first portion of the multi-layered spacer covers a top surface of the stack, and a second portion of the multi-layered spacer covers a sidewall of the stack.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A phase-change memory device embedded in an interconnect structure of a semiconductor die, the phase-change memory device comprising:
   a first electrode disposed on and electrically connected to an interconnect wiring of the interconnect structure;
   a stack disposed on the first electrode, comprising:
      a phase-change layer disposed on the first electrode;
      a second electrode disposed on the phase-change layer; and
   a multi-layered spacer covering the stack,
   wherein a first portion of the multi-layered spacer covers a top surface of the stack, and a second portion of the multi-layered spacer covers a sidewall of the stack,
   wherein the multi-layered spacer comprises:
   a first nitride layer covering the stack, the first nitride layer comprising a first top portion covering the top surface of the stack and a first sidewall portion covering the sidewall of the stack; and
   an oxide layer disposed on the first nitride layer, the oxide layer comprising a second top portion covering the first top portion of the first nitride layer and a second sidewall portion covering the first sidewall portion of the first nitride layer, wherein a thickness ratio of the second portion to the first portion ranges from about 0.67 to about 0.82.

2. The phase-change memory device of claim 1, wherein a thickness ratio of the first sidewall portion to the first top portion ranges from about 0.65 to about 0.8.

3. The phase-change memory device of claim 2, wherein a thickness ratio of the second sidewall portion to the second top portion ranges from about 0.88 to about 1.

4. The phase-change memory device of claim 1, wherein the multi-layered spacer further comprises:
   a second nitride layer disposed on the oxide layer, the second nitride layer comprising a third top portion covering the second top portion of the oxide layer and a third sidewall portion covering the second sidewall portion of the oxide layer.

5. The phase-change memory device of claim 4, wherein a thickness ratio of the third sidewall portion to the third top portion ranges from about 0.7 to about 0.81.

6. The phase-change memory device of claim 1, wherein a thickness ratio of the second sidewall portion to the second top portion ranges from about 0.88 to about 1.

7. The phase-change memory device of claim 1, wherein the stack comprises a tapered sidewall.

8. A phase-change memory device in an interconnect structure over transistors, the phase-change memory device comprising:

a first electrode disposed on and electrically connected to an interconnect wiring of the interconnect structure;

a phase-change layer disposed on the first electrode;

a second electrode disposed on the phase-change layer;

a hard mask disposed on the second electrode; and a multi-layered spacer covering a stack of the phase-change layer, the second electrode and the hard mask, wherein a first portion of the multi-layered spacer covers a top surface of the stack, and a second portion of the multi-layered spacer covers a sidewall of the stack, wherein the multi-layered spacer comprises at least one nitride layer and at least one oxide layer, each nitride layer and each oxide layer are alternately stacked to each other, and wherein a ratio of a second thickness of the second portion to a first thickness of the first portion ranges from about 0.67 to about 0.85.

9. The phase-change memory device of claim 8, wherein the multi-layered spacer comprises:

a first nitride layer covering the stack, the first nitride layer comprising a first top portion covering the top surface of the stack and a first sidewall portion covering the sidewall of the stack; and an oxide layer disposed on the first nitride layer, the oxide layer comprising a second top portion covering the first top portion of the first nitride layer and a second sidewall portion covering the first sidewall portion of the first nitride layer.

10. The phase-change memory device of claim 8, wherein a thickness ratio of the second portion to the first portion ranges from about 0.67 to about 0.82.

11. The phase-change memory device of claim 10, wherein a thickness ratio of the first sidewall portion to the first top portion ranges from about 0.65 to about 0.8, and a thickness ratio of the second sidewall portion to the second top portion ranges from about 0.88 to about 1.

12. The phase-change memory device of claim 10, wherein the multi-layered spacer further comprises:

a second nitride layer disposed on the oxide layer, the second nitride layer comprising a third top portion covering the second top portion of the oxide layer and a third sidewall portion covering the second sidewall portion of the oxide layer, a thickness ratio of the third sidewall portion to the third top portion ranges from about 0.7 to about 0.81.

13. The phase-change memory device of claim 10, wherein a thickness of the oxide layer is less than 2 nm.

14. The phase-change memory device of claim 8, wherein a thickness of the oxide layer is less than 2 nm.

15. A phase-change memory device in an interconnect structure, the phase-change memory device comprising:

a stack disposed on a dielectric layer of the interconnect structure and electrically connected to a first electrode of the interconnect structure, the stack comprising:
a phase-change layer disposed on the first electrode;
a second electrode disposed on the phase-change layer; and a multi-layer covering the stack and the dielectric layer of the interconnect structure, wherein a first portion of the multi-layer covers a top surface of the stack, and a second portion of the multi-layer covers a sidewall of the stack, wherein the multi-layer comprises:

a first nitride layer covering the stack and the dielectric layer of the interconnect structure, the first nitride layer comprising a first top portion covering the top surface of the stack and a first sidewall portion covering the sidewall of the stack; and an oxide layer disposed on the first nitride layer, the oxide layer comprising a second top portion covering the first top portion of the first nitride layer and a second sidewall portion covering the first sidewall portion of the first nitride layer, wherein a thickness ratio of the second portion to the first portion ranges from about 0.67 to about 0.82.

16. The phase-change memory device of claim 15, wherein a thickness ratio of the first sidewall portion to the first top portion ranges from about 0.65 to about 0.8.

17. The phase-change memory device of claim 16, wherein a thickness ratio of the second sidewall portion to the second top portion ranges from about 0.88 to about 1.

18. The phase-change memory device of claim 16, wherein the multi-layer further comprises:

a second nitride layer disposed on the oxide layer, the second nitride layer comprising a third top portion covering the second top portion of the oxide layer and a third sidewall portion covering the second sidewall portion of the oxide layer, a thickness ratio of the third sidewall portion to the third top portion ranges from about 0.7 to about 0.81.

19. The phase-change memory device of claim 16, wherein a thickness of the oxide layer is less than 2 nm.

20. The phase-change memory device of claim 15, wherein a thickness of the oxide layer is less than 2 nm.

\* \* \* \* \*